(12) United States Patent
Fox et al.

(10) Patent No.: US 10,060,960 B1
(45) Date of Patent: Aug. 28, 2018

(54) ION MEASURING DEVICE

(71) Applicants: Glenn Fox, Miami, FL (US); Ellen A. Fox, Miami, FL (US); Warren H. Fox, Deerfield Beach, FL (US)

(72) Inventors: Glenn Fox, Miami, FL (US); Ellen A. Fox, Miami, FL (US); Warren H. Fox, Deerfield Beach, FL (US)

( * ) Notice: Subject to any disclaimer, the term of this patent is extended or adjusted under 35 U.S.C. 154(b) by 0 days.

(21) Appl. No.: 15/907,016

(22) Filed: Feb. 27, 2018

(51) Int. Cl.
| | |
|---|---|
| *G01W 1/00* | (2006.01) |
| *G01R 29/08* | (2006.01) |
| *G01W 1/16* | (2006.01) |
| G08B 21/00 | (2006.01) |
| G08B 1/08 | (2006.01) |
| G01R 31/02 | (2006.01) |

(52) U.S. Cl.
CPC ........... *G01R 29/0842* (2013.01); *G01W 1/16* (2013.01)

(58) Field of Classification Search
CPC .............................. G01R 29/0842; G01W 1/16
USPC ........................................................ 340/601
See application file for complete search history.

(56) References Cited

U.S. PATENT DOCUMENTS

| | | | | |
|---|---|---|---|---|
| 3,753,117 A | * | 8/1973 | Downing ................. | G01W 1/04 73/170.24 |
| 4,056,772 A | * | 11/1977 | Graf von Berckheim ................... | G01N 27/60 324/72 |
| 5,521,603 A | * | 5/1996 | Young ..................... | G01W 1/16 342/198 |
| 6,828,911 B2 | | 12/2004 | Jones | |
| 7,171,308 B2 | * | 1/2007 | Campbell ............... | G01W 1/00 702/4 |
| 7,868,811 B1 | * | 1/2011 | Woodell ................... | G01S 7/22 342/26 B |
| 9,057,773 B1 | * | 6/2015 | Fersdahl ............... | G01S 13/953 |
| 9,244,157 B1 | * | 1/2016 | Sishtla ................... | G01S 7/062 |
| 2008/0143518 A1 | * | 6/2008 | Aaron ............... | H04M 1/72569 340/540 |

* cited by examiner

*Primary Examiner* — Jack K Wang
(74) *Attorney, Agent, or Firm* — Sanchelima & Associates, P.A.; Christian Sanchelima, Esq.; Jesus Sanchelima, Esq.

(57) ABSTRACT

An ion measuring device to measure ionic activity in its vicinity is disclosed. The ion measuring device includes a housing to protect its internal components, such as an ion sensing assembly from damage due to exposure to environment. The housing allows the ion sensing assembly to conduct readings of the atmosphere while keeping debris and other elements that may skew the readings away from the ion sensing assembly. The ion measuring device include means to covert readings at the ion sensing assembly into digital data. The ion measuring device further includes electronic means that collects and records data gathered by the ion sensing assembly, and further be able to transmit the data to a remote base station for further processing and analysis.

20 Claims, 8 Drawing Sheets

ION MEASURING DEVICE

II. BACKGROUND OF THE INVENTION

1. Field of the Invention

The present invention relates to an ion measuring device and, more particularly, to an ion measuring device that is digital and includes a housing for its ion sensing assembly.

2. Description of the Related Art

Several designs for ion measuring devices have been proposed in the past. None of them, however, include a digital configuration to transmit a digital signal, which has more accurate readings than the analog configurations in the prior art.

Applicant believes that the closest reference corresponds to U.S. Pat. No. 6,828,911 issued to Jones et al. on Dec. 7, 2004 for a lightning detection and prediction alarm device. The Jones references discloses a device using an ion sensing means for detecting molecular change in the atmosphere. However, the Jones reference has an analog configuration instead of a digital configuration and it uses an exposed dome as the ion sensing means. The exposed dome can provide false readings when affected by environmental elements such as rain. The Jones reference differs from the present invention because the present invention includes a housing to protect the metal ion sensing plate from the elements. The present invention uses slits to allow ions in to read atmospheric information while not allowing rain or debris to skew the readings.

Further, the present invention does not require the continuous transmission of a voltage to the device to verify that the device is working properly, as the Jones reference requires. The present invention does not need this because its steel ion sensing element is directly connected to the device's electronics so there is no failure or need to constantly send a signal to check if the device is working properly. Notably, the present invention differs from the Jones reference because the Jones reference uses an analog configuration. The present invention being digital allows for additional capabilities to be installed in the device that can deliver information quicker and more reliably.

The cable for the digital configuration can be of any length as opposed to the limited length allowed by an analog configuration. Further, the digital cable can be more readily grounded. The triaxial cable used in the prior art cannot be as readily grounded.

None of the references in the prior art include a housing to protect the ion sensing means and none of the references teach, suggest, or motivate the use of such a housing together combined with a digital configuration in a lightning sensing device.

Other documents describing the closest subject matter provide for a number of more or less complicated features that fail to solve the problem in an efficient and economical way. None of these patents suggest the novel features of the present invention.

III. SUMMARY OF THE INVENTION

It is one of the main objects of the present invention to provide an ion measuring device that is digital and can be connected to the Internet or other instruments to give readings reliably and in real-time.

It is another object of this invention to provide an ion measuring device that uses a housing to protect its ion sensing means from the elements while still exposing it sufficiently to take accurate atmospheric readings.

It is still another object of the present invention to provide an ion measuring device that includes electronics mounted adjacent to the ion sensing means for more accurate readings as information is not skewed or lost as it travels down the ion measuring device.

It is yet another object of this invention to provide such a device that is inexpensive to implement and maintain while retaining its effectiveness.

Further objects of the invention will be brought out in the following part of the specification, wherein detailed description is for the purpose of fully disclosing the invention without placing limitations thereon.

IV. BRIEF DESCRIPTION OF THE DRAWINGS

With the above and other related objects in view, the invention consists in the details of construction and combination of parts as will be more fully understood from the following description, when read in conjunction with the accompanying drawings in which.

V. DETAILED DESCRIPTION OF THE EMBODIMENTS OF THE INVENTION

Figure 1A:
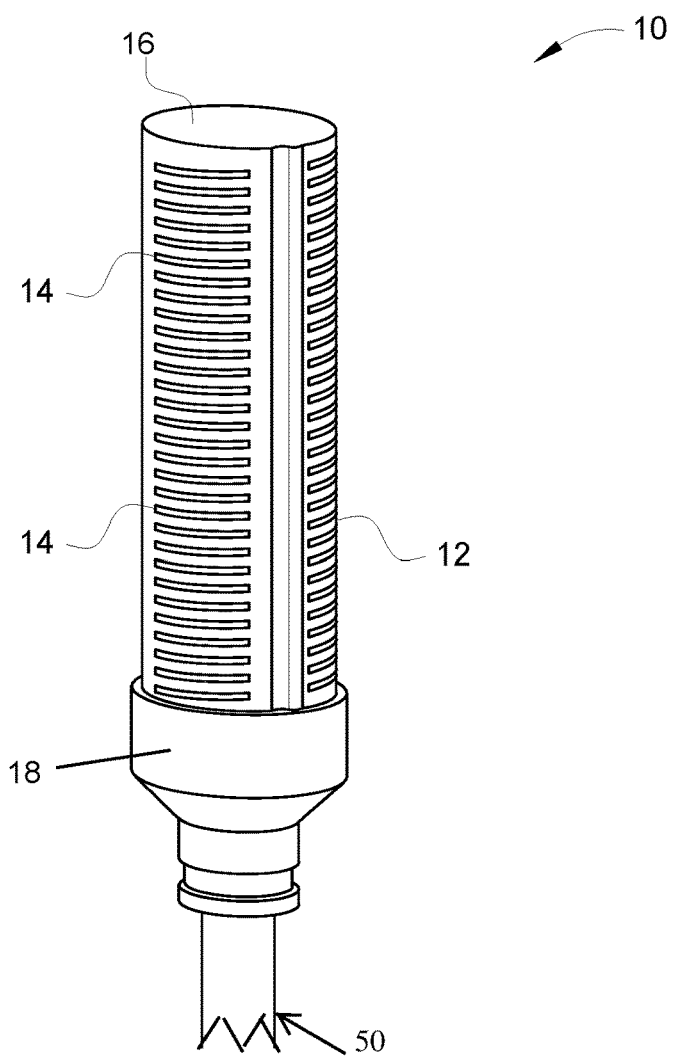
FIG. 1A illustrates an isometric view of an ion measuring device mounted on ground, in accordance with one or more embodiments of the present disclosure.
Figure 1B:
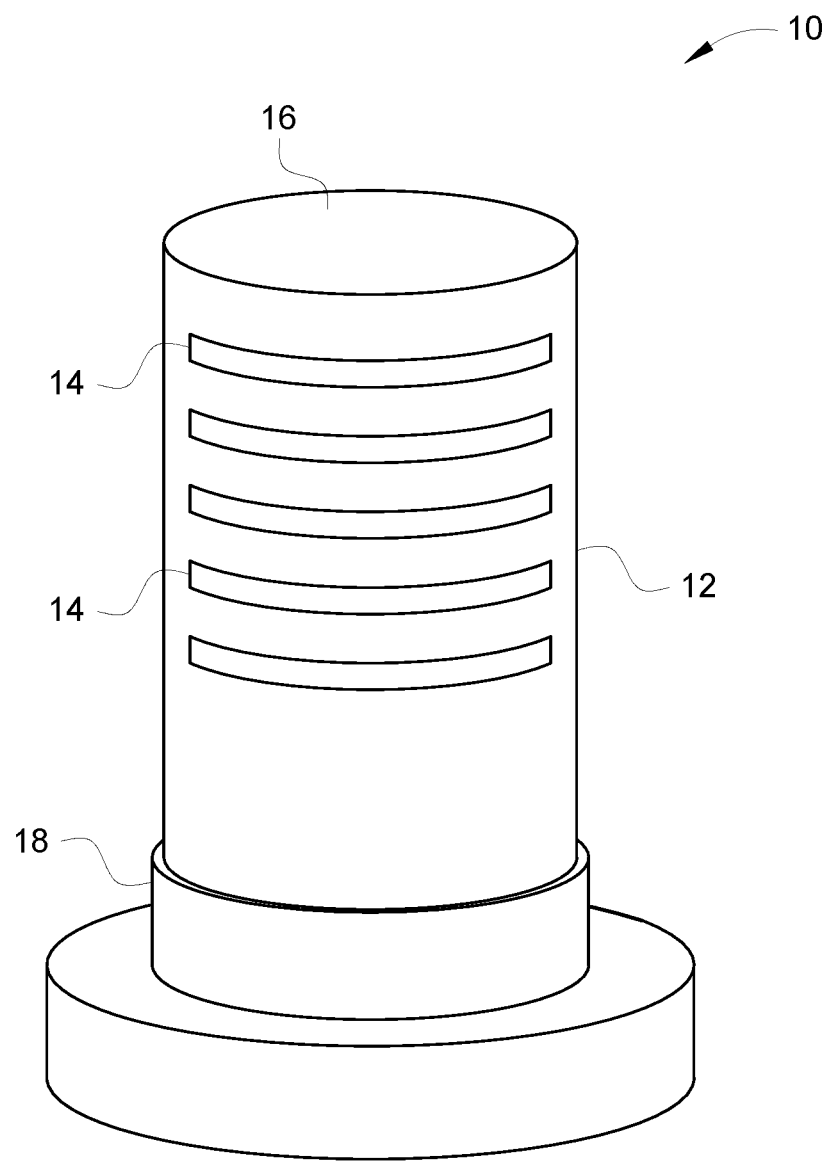
FIG. 1B illustrates a simplified representation of the ion measuring device of FIG. 1A, in accordance with one or more embodiments of the present disclosure.

Referring now to the drawings, the present invention generally relates to an ion measuring device. FIG. 1A illustrates an ion measuring device in accordance with one or more embodiments of the present disclosure, which is generally referred to by means of numeral 10. FIG. 1B illustrates a simplified representation of the ion measuring device 10. The ion measuring device 10 is hereinafter sometimes simply referred to as the "device 10." The device 10 utilizes electrostatic detection technique for measuring ionic charges in its vicinity. In one embodiment, the ion measuring device 10 of the present disclosure can be used to detect lightning activity in a region by measuring the ionic charge generated by the lightning activity in the concerned region. This can be achieved since lightning is an energetic electric discharge process in the atmosphere. The lightning discharges can also be used as an indicator for forecasting of severe weather and may further be used as an indicator for measuring the concentration of greenhouse gases in the atmosphere, and consequently the present device 10 can potentially be used to provide indirect measurements for concentration of greenhouse gases, weather activities, and other related phenomenon. As shown on FIG. 3, device 10 includes ion sensing plate 11, longitudinal slit 11a (shown in FIG. 5), housing 12, slits 14 (shown in FIG. 1A-2), rubber element 15, top end 16, threaded bushing 17, bottom end 18, and bottom opening 19.

Device 10 also includes circuit board assembly 20 having computer 22, analog/digital converter 24, antenna 26, and female connector 28 (such as RG 59). Device 10 further includes wiring assembly 30, first wire 32, second wire 34, first ion sensing plate connection 36, first computer connection 36a, second ion sensing plate connection 38, and second computer connection 38a.

As illustrated in FIG. 1A and FIG. 1B, the device 10 includes a housing 12 to provide structural support to the various components to be installed inside therein. In the illustrated examples, the housing 12 is shown in the form of a cylindrical tube; however, it may be contemplated that the housing 12 may have any other suitable shape without any limitations. For instance, in other examples, the housing 12 may have a cuboidal shape. The housing 12 may have appropriate dimensions, viz. diameter and length, so as to properly accommodate various components to be installed inside therein. The housing 12 may be constructed of weather-proof material, such as hard plastic or the like, in order to withstand atmospheric activities when exposed to the outside environment. In one example, as illustrated more clearly in FIG. 1B, the housing 12 of the device 10 may be connected to the ground 'G' to earth the electronic components in the device 10. In one embodiment, the housing 12 may have a closed top end 16 and an open bottom end. Further, as illustrated, the housing 12 may provide a plurality of slits 14 disposed and extending along the vertical length thereof. In one example, the slits 14 may be in the form of horizontal openings formed in the housing 12. The slits 14 may be of predetermined dimensions such that the slits 14 allow air carrying ion particles from the atmosphere inside the housing 12 while keeping debris and other elements that may skew ion sensing out of the housing 12.

Figure 2:
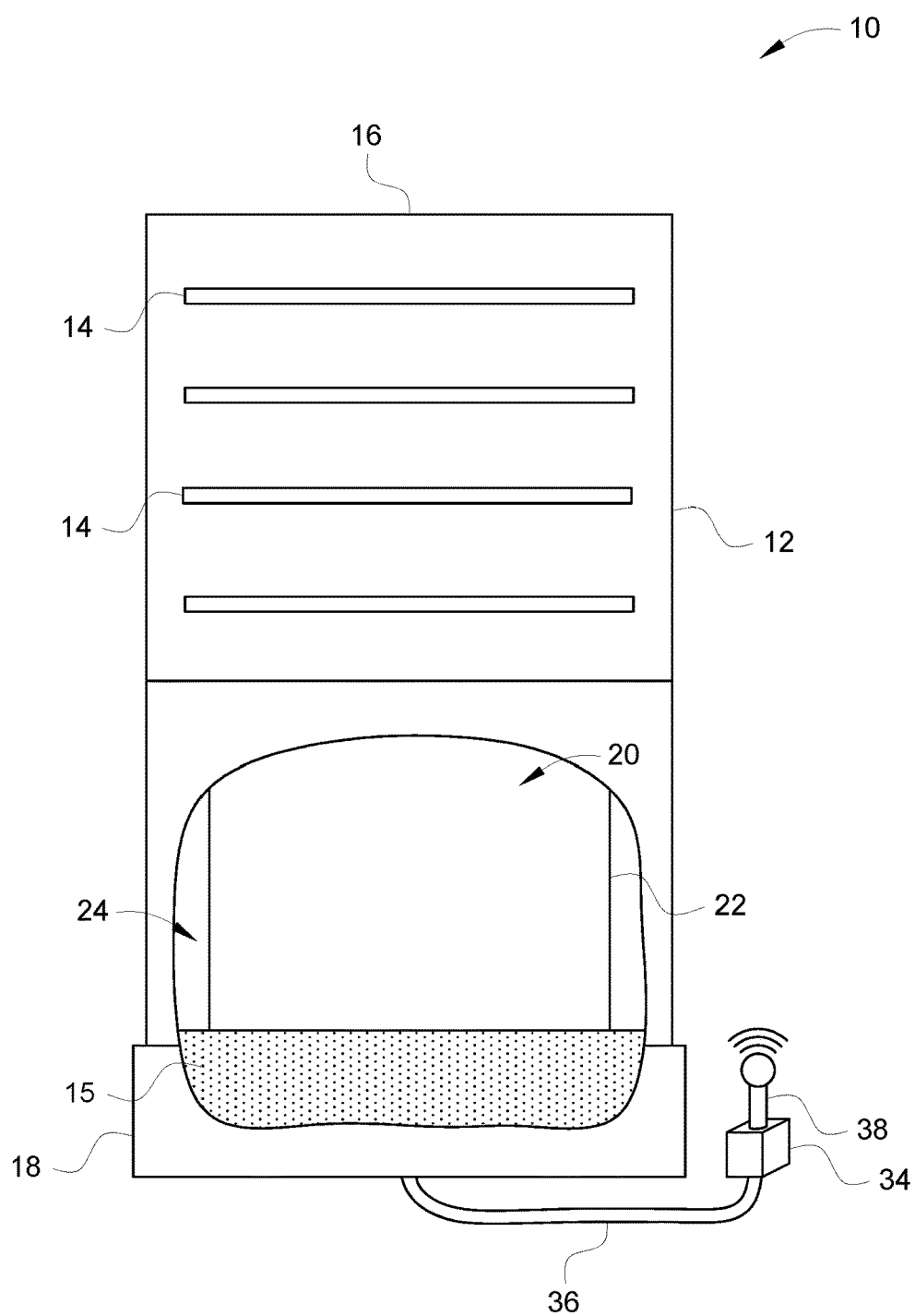
FIG. 2 illustrates a front elevation view of the ion measuring device of FIG. 1A showing an ion sensing assembly in a housing thereof, in accordance with one or more embodiments of the present disclosure.
Figure 3:
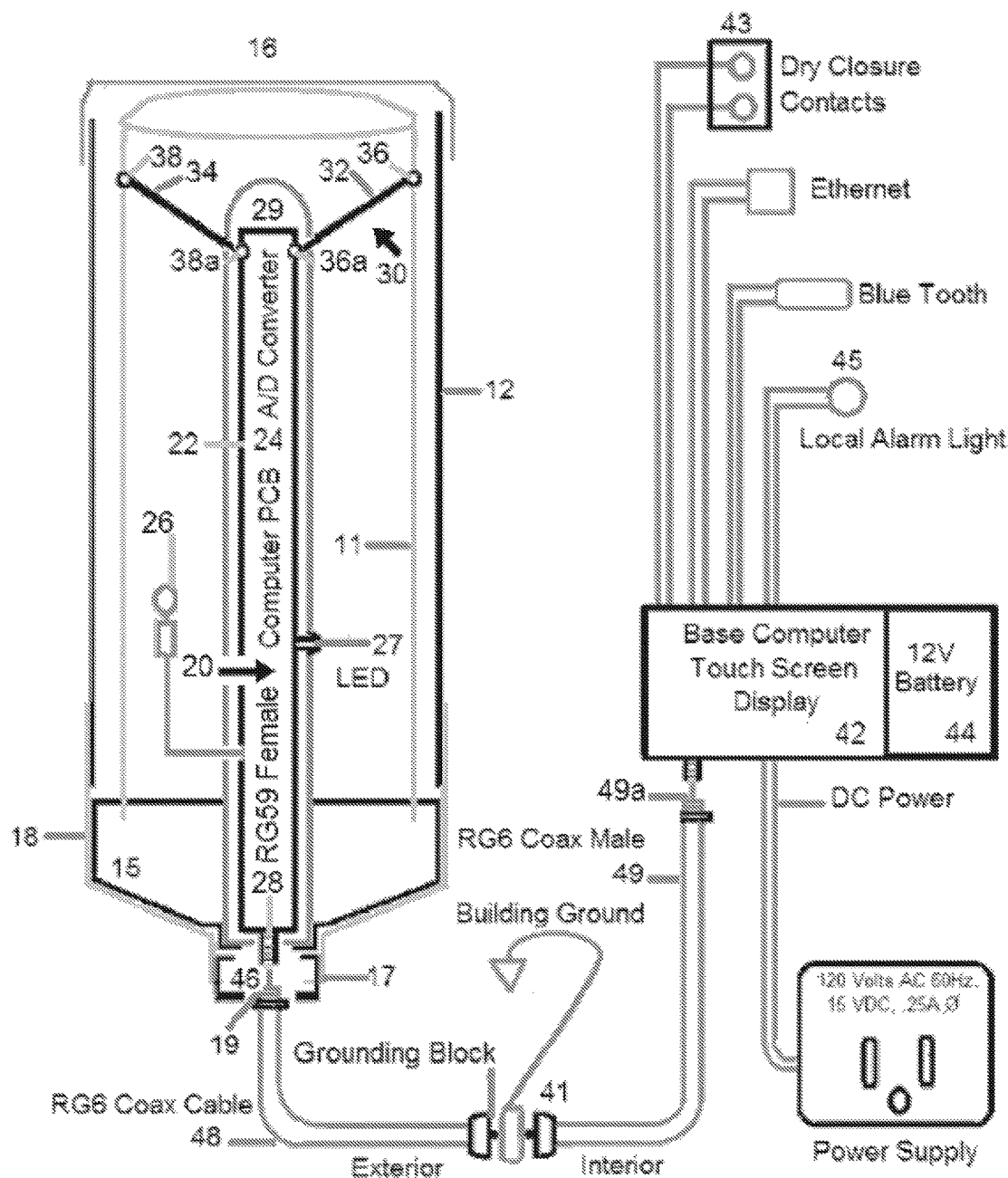
FIG. 3 illustrates a cross-section view of the ion measuring device of FIG. 1A showing the ion sensing assembly within the housing, in accordance with one or more embodiments of the present disclosure.
Figure 4:
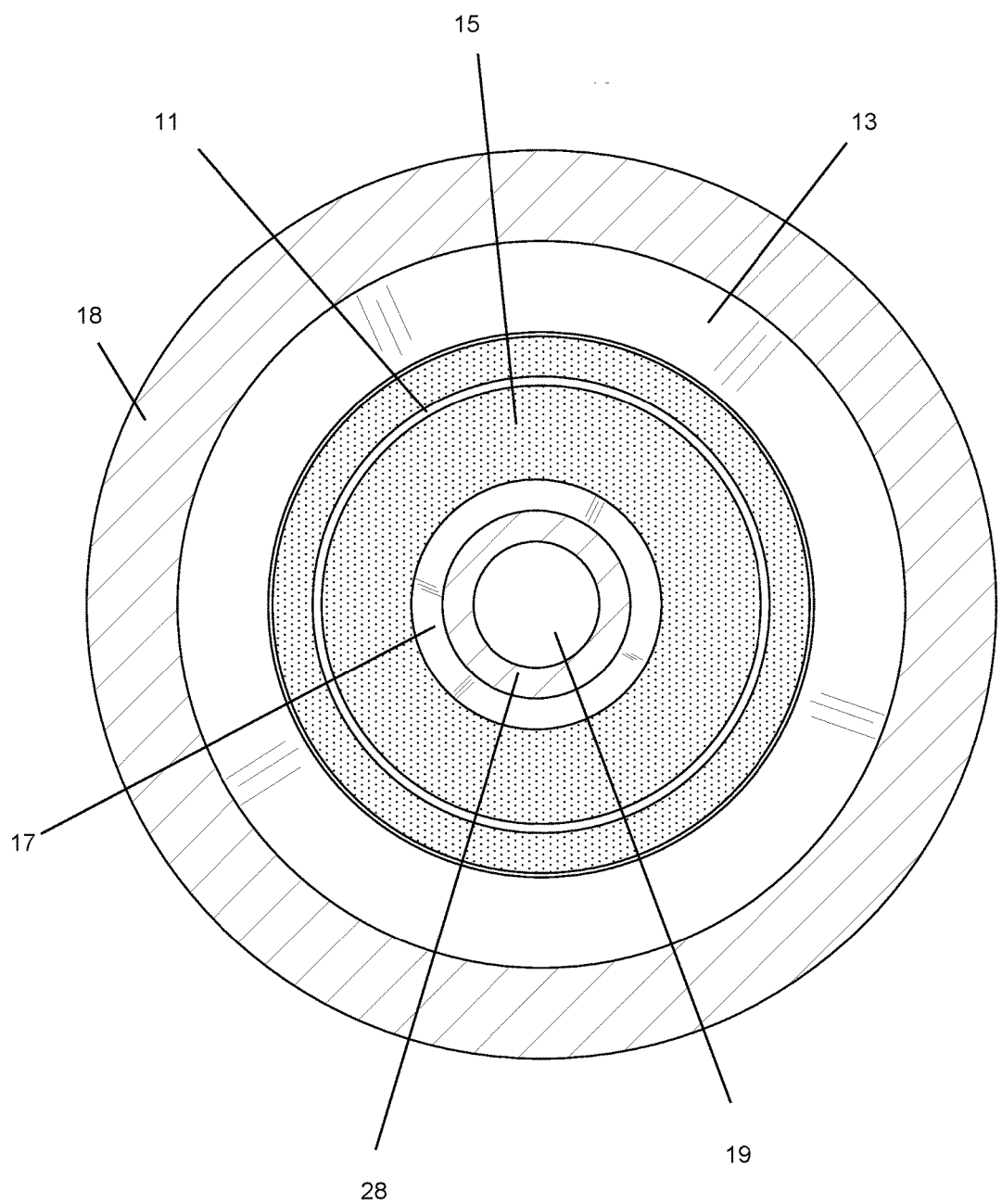
FIG. 4 illustrates a top view of a base assembly of the ion measuring device, in accordance with one or more embodiments of the present disclosure.
Figure 6:
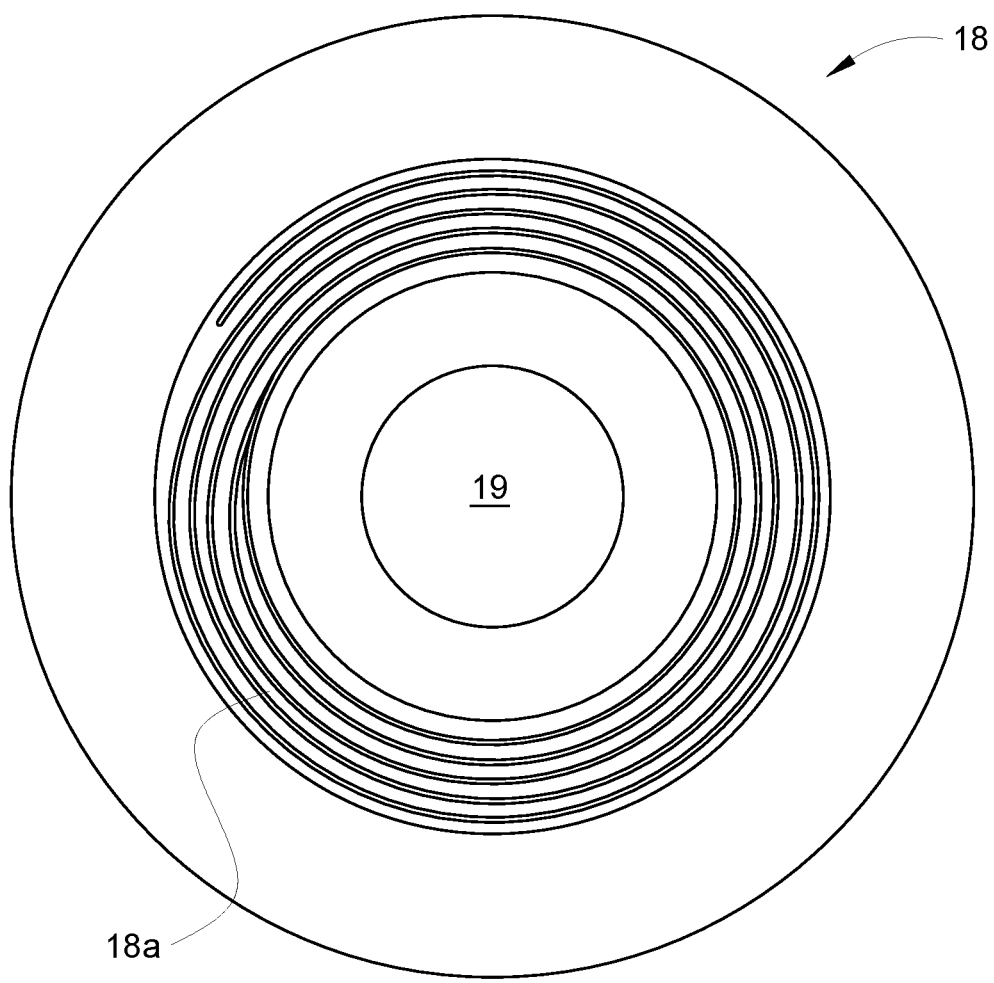
FIG. 6 illustrates the base assembly of the ion measuring device, in accordance with one or more embodiments of the present disclosure.

FIG. 2 illustrates a detailed front elevation view of the device 10 with a partial cutaway portion of the housing 12 to show its internal components, while FIG. 3 illustrates a cross-section view of the housing 12 in the device 10, in accordance with the device 10 of FIG. 1B. As illustrated in the associated drawings, the device 10 includes a base assembly 18 covering the open bottom end of the housing 12. FIG. 4 illustrates a top view of the base assembly 18 and FIG. 6 illustrates a bottom view of the base assembly 18 respectively, in accordance with the device 10 of FIG. 1A. Typically, the base assembly 18 may be constructed of same material as the housing 12. It may be understood that the base assembly 18 may be removed to access the inside of the housing 12. Further, the base assembly 18 may provide an opening 19 (as illustrated more clearly in FIG. 3) at a bottom thereof. In one example, the said opening 19 may be in the form of a circular opening extending through the base assembly 18.

Figure 5:
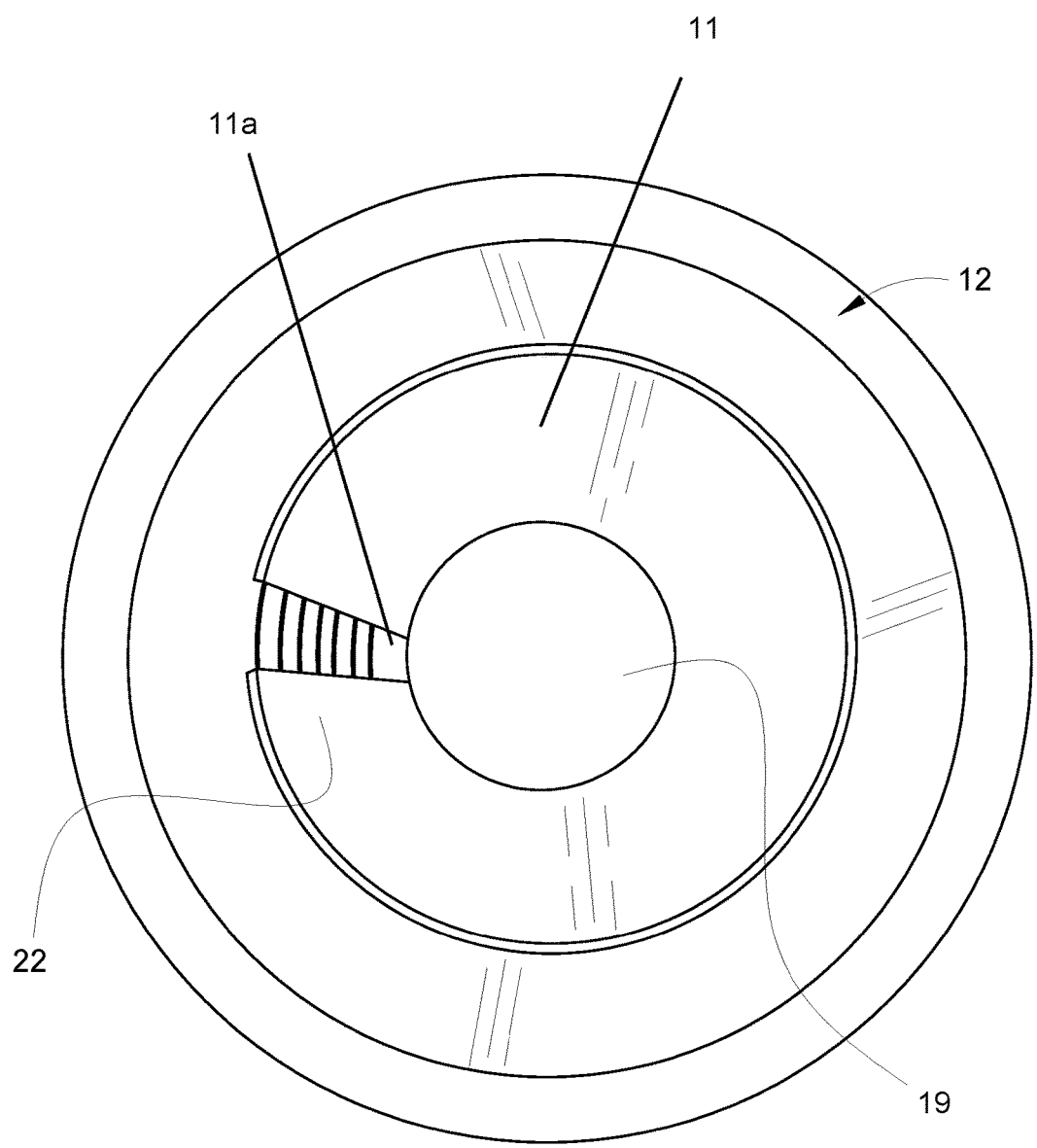
FIG. 5 illustrates a top view of the housing of the ion measuring device showing a tubular plate therein, in accordance with one or more embodiments of the present disclosure.

FIG. 5 illustrates a bottom view of the housing 12 with the ion sensing plate 11 inside therein. As illustrated, the ion sensing plate 11 may provide a longitudinal slit 11a running along the length thereof. In the present embodiment, the ion sensing plate 11 is made of metallic material with high conductivity characteristics. It may be contemplated from the drawings that the ion sensing plate 11 may generally be in the form of a hollow cylindrical member placed inverted with one of its open edges located near the bottom end of the housing 12. In one example, the ion sensing plate 11 may be supported by being at least partially inserted into rubber element 15 which is located within base 18 at the bottom end of housing 12. In particular, the ion sensing plate 11 may be concentrically positioned inside housing 12 with respect to the cylindrical inside surface of housing 12, defining a spacing 13 between the ion sensing plate 11 and the inside surface and housing 12. The device 10 may include a rubber element 15 disposed in the housing 12 and extending along the circumference of the spacing 13 defined between the ion sensing plate 11 and the inside surface of the housing 12. In the present examples, as illustrated in FIGS. 3 and 4, the rubber element 15 provides a rubber opening located near the bottom end of the housing 12 and cooperating with bottom opening 18.

As shown in FIG. 4 (which does not include computer 22), the top cross-sectional view of base 18 bushing 17 is shown having female connector 28 therein which in turn can be connected to opening 19. A potting material or compound 29 is placed around computer 22 to protect it from environmental elements. Ion sensing plate 11 is configured to detect voltage changes due to the presence of charged ions inside housing 12. As may be understood, such charged ions may have been carried by the air from the outer atmosphere into the housing 12 via slits 14. Typically, in case of a lightning strike, an either positive or negative static charge is produced. The imbalance in the atmosphere caused by lightning discharging to the ground is detected by the ion sensing plate 11.

Further, as illustrated in FIG. 3, circuit board assembly 20 includes a computer 22, an analog/digital converter 24, antenna 26, LED 27, and female connector 28. Computer 22 may be a potted structure nested within the rubber element 15. Analog/digital converter 24 is part of computer 22 and takes the analog DC voltage coming from ion sensing plate 11 and converts it to a digital format. Female connector 28 goes into F-connector 46 of first cable 48. Antenna 26 provides Bluetooth® and/or Wi-Fi connectivity. LED 27 is also located on computer 22 and protrudes off computer 22 and is visible through slits 14 to notify users about the current operation of computer board 22 depending on colors or patterns displayed (i.e. power failures, storm activity, etc.).

As illustrated, ion sensing plate 11 is partially inserted into rubber element 15 keeping it in position to distance ion sensing plate 11 from housing 12 to stop vibration and prevent short circuit. The ion sensing plate 11 may be a solid metallic plate, such as a steel plate with desired properties including, low electric conductivity and low electric charge storing capacity. In accordance with an embodiment, ion sensing plate 11 may include at least two wires which are connected to computer 22. As illustrated, wire assembly 30 includes a first wire 32 connected to ion sensing plate 11 from first ion sensing plate connection 36 to first computer connection 36a. Wire assembly 30 also includes second wire 34 connected from ion sensing plate 11 at second ion sensing plate connection 38 to second computer connection 38a. In the present example, first wire 32 and second wire 34 may be soldered to first and second computer connections 36a; 38a along a predetermined location on computer 22 and connected to first and second ion sensing plate connections 36; 38 by means of self-clinching fasteners or similar fasteners as known in the art.

Figure 7:
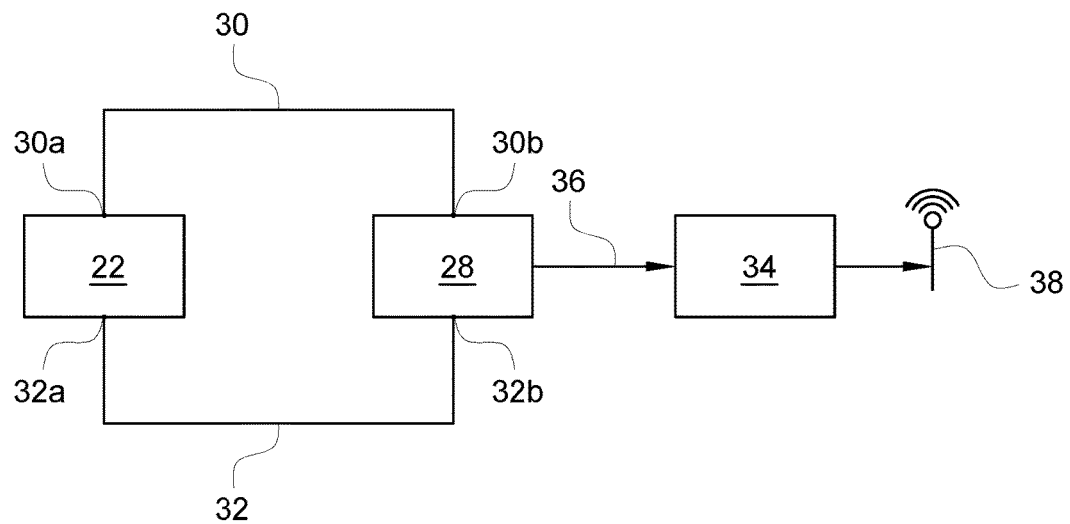
FIG. 7 illustrates a schematic representation of electric connections between various components in the ion measuring device, in accordance with one or more embodiments of the present disclosure.

FIG. 7 schematically illustrates the electric circuit formed between the various electronic components in the device 10. In one example, first and second cables 48; 49 can be a RG6 cable which is heavier gauge and has thicker insulation and better shielding, and thus suited for high bandwidth, immunity to RF interference and high frequency applications. By converting the data to digital and it can be used to extract the imbalance that occurred in the atmosphere to make better decisions based on the information provided by the analog/digital converter 24.

Device 10 includes base computer assembly 40, grounding block 41, base computer 42, dry closure contacts 43, battery 44, local alarm light 45, male connector 46, first cable 48 (such as an RG6), and second cable 49 (such as an RG6), base computer F-connector 49a. The device can be mounted to a ground structure, building, pole or the like using mounting assembly 50. Base computer 42 is connected to computer 22 using (in reverse order) a base computer female connector 49a, connected to second cable 49, connected to grounding block 41 which connects to first cable 48 that is connected to female connector 28 using male connector 46. In turn, female connector 28 is part of the computer board of computer 22, thereby connecting base computer 42 to computer 22.

In one example, the analog/digital converter 24 provides the deviation in voltage which is analyzed by base computer assembly 40. In one embodiment, analog/digital converter 24 obtains its data from the differentiation between first wire 32 and the second wire 34. The information obtained by the analog/digital converter 24 is sent to computer 22 and is then is transmitted using an OOK (on/off keying) protocol to base computer assembly 40.

In one or more embodiments, the device 10 may also include an antenna 26 that can wirelessly transmit data picked up by the analog/digital converter 24 to base computer assembly 40. Further, in some examples, the present device 10 may also include a location determination means, such as a GPS (Global Positioning System) based sensor to transmit location data along with the reading data to the base computer assembly 40.

As discussed, in one configuration, device 10 of the present disclosure may be implemented for detecting lighting activity in the atmosphere by detecting atmospheric changes on an electro-molecular level for efficiently detecting lighting strikes. It may be contemplated that the natural static charge level contained in the immediate atmosphere surrounding the device 10 may be affected by the relative humidity, temperature, the sun, the lack of sunlight, local electrical noise generated by electrical power, humans and animals walking by, and other natural phenomena. Therefore, the device 10 is preferably placed away from trees, buildings and other objects to maximize sensitivity and optimal performance of the ion sensing plate 11 therein.

Slits 14, located in housing 12, will allow the ion sensing plate 11 to conduct readings of the atmosphere while keeping debris and other elements that may skew the readings away from the ion sensing plate 11. It may be contemplated by a person skilled in the art that the present device 10 may not require the continuous transmission of a voltage to the ion sensing plate 11 to verify that the device 10 is working properly, as the ion sensing plate 11 is directly connected to the electronics means so there is no failure or need to constantly send a signal to check if the device 10 is working properly. Housing 12 can include a cap 16a, that can be made of different materials, to close the top opening 16 of housing.

Mounting assembly 50 can include a pole that's mounted through opening 19 and to a base or ground structure, or a building.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. A weather sensing device, comprising:
   a) a housing having a bottom end having an opening;
   b) an ion sensing plate;
   c) a computer;
   d) an analog/digital converter;
   e) a base computer station assembly having a base computer station;
   f) a cable connecting said computer to said base computer station;
   g) at least one wire connecting said ion sensing plate to said computer;
   h) said housing having a plurality of slits configured to allow air through without allowing debris through;
   i) a rubber element adapted to receive the bottom of said ion sensing plate; and
   j) said ion sensing plate kept upright by said rubber element.

2. The weather sensing device of claim 1 wherein said computer is configured to transmit data to said base computer station using an on/off keying protocol.

3. The weather sensing device of claim 1 wherein said computer includes a global positioning system adapted to transmit location data to said base computer assembly.

4. The weather sensing device of claim 1 including a Wi-Fi or Bluetooth antenna to transmit data to said base computer station wirelessly.

5. The weather sensing device of claim 1 having at least one LED light inside said housing and adapted to be visible through said slits.

6. The weather sensing device of claim 1 wherein said ion sensing plate in configured to detect lightning activity, or weather related activities, in a given environment by detecting the imbalance in the environment caused by lightning discharging to the ground.

7. The weather sensing device of claim 1 wherein two wires are used to connect opposite sides of said ion sensing plate to said computer.

8. The weather sensing device of claim 1 wherein said wires are soldered to said computer or mounted to said computer using fasteners.

9. The weather sensing device of claim 1 wherein said housing includes a top end and a cap, said cap adapted to cover said top end.

10. The weather sensing device of claim 1 wherein said rubber element is adapted to take up substantially the entire area within said housing at said bottom end.

11. The weather sensing device of claim 1 wherein said ion sensing plate is positioned upright within said rubber element at a distance away from said housing to define a spacing between said rubber element and said housing.

12. The weather sensing device of claim 1 including a first and second cable both being an RG6 and connected to each other using a grounding block.

13. The weather sensing device of claim 12 wherein said first cable is connected to said computer using a female connector and an F-connector.

14. The weather sensing device of claim 1 further including a mounting assembly configured to mount said weather sensing device to a building or ground surface.

15. The weather sensing device of claim 1 wherein said computer is a potted structure and is nested within said rubber element.

16. The weather sensing device of claim 1 wherein said ion sensing plate includes a longitudinal slit.

17. The weather sensing device of claim 1 wherein said ion sensing plate is cylindrical.

18. The weather sensing device of claim 1 wherein said rubber element includes an opening adapted to allow said female connector or at least one cable to pass through.

19. The weather sensing device of claim 1 wherein said base computer station assembly includes a battery, an alarm, a base computer female connector used to connect said at least one cable, a base computer F-connector, a male connector, a grounding block, Ethernet capability, and power means.

20. The weather sensing device of claim 5 wherein said LEDs are mounted to said computer and adapted to provide users with the current operation of said computer.

* * * * *